United States Patent
Kahn et al.

(10) Patent No.: US 11,804,415 B2
(45) Date of Patent: *Oct. 31, 2023

(54) SEMICONDUCTOR DEVICE WITH FIRST AND SECOND PORTIONS THAT INCLUDE SILICON AND NITROGEN

(71) Applicant: Infineon Technologies AG, Neubiberg (DE)

(72) Inventors: Markus Kahn, Rangersdorf (AT); Oliver Humbel, Maria Elend (AT); Philipp Sebastian Koch, Gelugor (MY); Angelika Koprowski, Klagenfurt (AT); Christian Maier, Egg am See (AT); Gerhard Schmidt, Wernberg-Wudmath (AT); Juergen Steinbrenner, Noetsch (AT)

(73) Assignee: Infineon Technologies AG, Neubiberg (DE)

( * ) Notice: Subject to any disclaimer, the term of this patent is extended or adjusted under 35 U.S.C. 154(b) by 224 days.

This patent is subject to a terminal disclaimer.

(21) Appl. No.: 17/333,107

(22) Filed: May 28, 2021

(65) Prior Publication Data

US 2021/0287954 A1    Sep. 16, 2021

Related U.S. Application Data

(63) Continuation of application No. 16/556,642, filed on Aug. 30, 2019, now Pat. No. 11,075,134.

(30) Foreign Application Priority Data

Sep. 7, 2018  (DE) .......................... 102018121897.4

(51) Int. Cl.
  *H01L 29/06* (2006.01)
  *H01L 23/31* (2006.01)
  (Continued)

(52) U.S. Cl.
  CPC ........ *H01L 23/3171* (2013.01); *C23C 16/345* (2013.01); *H01L 21/0217* (2013.01);
  (Continued)

(58) Field of Classification Search
  CPC ............. H01L 23/3171; H01L 29/7811; H01L 21/0217
  See application file for complete search history.

(56) References Cited

U.S. PATENT DOCUMENTS 8,963,250 B2 * 2/2015 Shimizu .................. H01L 21/84
                                                    257/369
2001/0013638 A1 8/2001 Lam et al.
(Continued)

FOREIGN PATENT DOCUMENTS

DE        10240449 A1      3/2004
DE    102017117819 A1      4/2018
(Continued)

*Primary Examiner* — Dale E Page
*Assistant Examiner* — Wilner Jean Baptiste
(74) *Attorney, Agent, or Firm* — Murphy, Bilak & Homiller, PLLC

(57) ABSTRACT

A semiconductor device includes: a semiconductor body having an active region and an edge termination region between the active region and a side surface of the semiconductor body; a first portion including silicon and nitrogen; a second portion including silicon and nitrogen, the second portion being in direct contact with the first portion; and a front side metallization in contact with the semiconductor body in the active region. The first portion separates the second portion from the semiconductor body. An average silicon content in the first portion is higher than in the second portion. The front side metallization is interposed between the first portion and the semiconductor body in the active region but not in the edge termination region, and/or the first (Continued)

portion and the second portion are both present in the edge termination region but not in the active region.

20 Claims, 4 Drawing Sheets

(51) Int. Cl.
    *H01L 23/29*     (2006.01)
    *H01L 23/00*     (2006.01)
    *C23C 16/34*     (2006.01)
    *H01L 21/02*     (2006.01)

(52) U.S. Cl.
    CPC ...... *H01L 21/02271* (2013.01); *H01L 23/291* (2013.01); *H01L 23/564* (2013.01); *H01L 29/0623* (2013.01)

(56) References Cited

U.S. PATENT DOCUMENTS

| | | |
|---|---|---|
| 2003/0216059 A1 | 11/2003 | McFadden et al. |
| 2007/0001176 A1 | 1/2007 | Ward, III et al. |
| 2008/0203541 A1 | 8/2008 | Makiyama |
| 2009/0197403 A1 | 8/2009 | Honda et al. |
| 2010/0096688 A1 | 4/2010 | Balseanu et al. |
| 2011/0223765 A1 | 9/2011 | Rajagopalan et al. |
| 2011/0272024 A1 | 11/2011 | Choi et al. |
| 2016/0086868 A1 | 3/2016 | Chuang et al. |
| 2016/0333030 A1* | 11/2016 | Jang ................ H01L 21/02219 |
| 2017/0323783 A1* | 11/2017 | Sanchez ........... H01L 21/02164 |

FOREIGN PATENT DOCUMENTS

| | | |
|---|---|---|
| EP | 0219982 A2 | 4/1987 |
| WO | 03096380 A2 | 11/2003 |
| WO | 2004105083 A2 | 12/2004 |

\* cited by examiner

SEMICONDUCTOR DEVICE WITH FIRST AND SECOND PORTIONS THAT INCLUDE SILICON AND NITROGEN

TECHNICAL FIELD

The present disclosure is related to semiconductor devices and to a method of manufacturing a semiconductor device.

BACKGROUND

In semiconductor devices such as power semiconductor diodes and power semiconductor switches, a passivation layer may protect portions of a semiconductor die and portions of a metallization during testing and packaging processes, and during use. The passivation layer protects the surface and forms a barrier against impurities and contaminants that otherwise may migrate from the ambient into active regions of the semiconductor device. Passivation layers may include dielectric or semi-insulating materials, for example, DLC (diamond-like carbon), amorphous silicon carbide (a-SiC), silicon oxide, stoichiometric silicon nitride ($Si_3N_4$) or polyimide.

SUMMARY

An embodiment of the present disclosure relates to a semiconductor device that includes a semiconductor body. A first portion is in direct contact with the semiconductor body. The first portion includes silicon and nitrogen. A second portion is in direct contact with the first portion. The second portion includes silicon and nitrogen. The first portion is between the semiconductor body and the second portion. An average silicon content in the first portion is higher than in the second portion.

A further embodiment of the present disclosure relates to a method of manufacturing a semiconductor device. The method includes providing a semiconductor substrate that has a main surface. A first portion is formed directly on the main surface. The first portion includes silicon and nitrogen. A second portion is formed directly on the first portion. The second portion includes silicon and nitrogen. In the first portion an average silicon content is higher than in the second portion.

Those skilled in the art will recognize additional features and advantages upon reading the following detailed description, and upon viewing the accompanying drawings.

BRIEF DESCRIPTION OF THE FIGURES

The accompanying drawings are included to provide a further understanding of the embodiments and are incorporated in and constitute a part of this specification. The drawings illustrate the semiconductor device and the method of the present disclosure and together with the description serve to explain principles of the embodiments. Other embodiments and intended advantages will be readily appreciated as they become better understood by reference to the following detailed description.

DETAILED DESCRIPTION

Figure 1A:
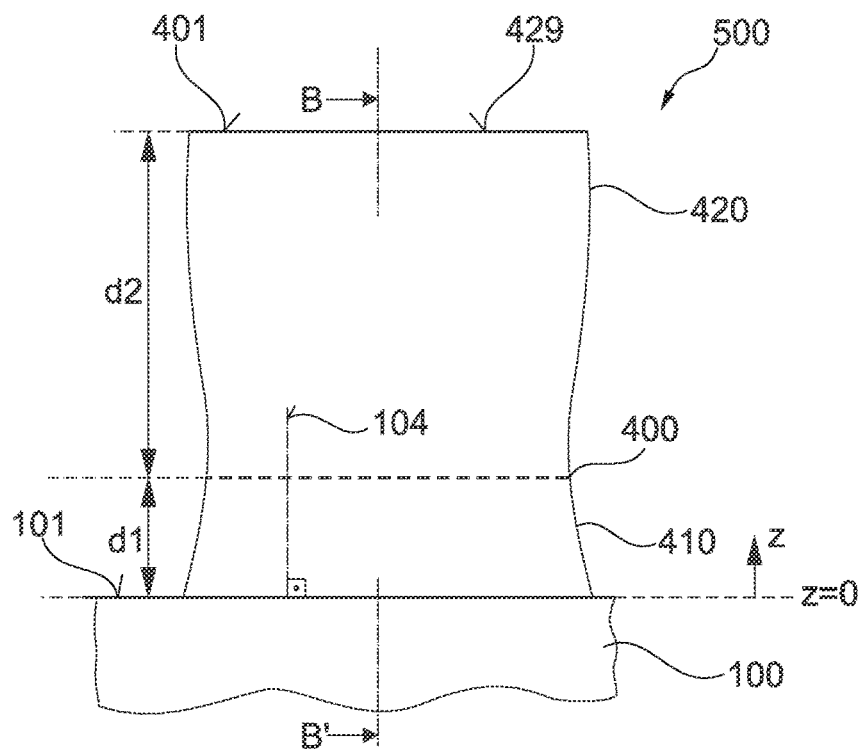
FIG. 1A is a schematic vertical cross-sectional view of a portion of a semiconductor device including a semi-insulating protection layer with a silicon-rich first portion and a second portion according to an embodiment.

In the following detailed description, reference is made to the accompanying drawings, which form a part thereof and in which are shown by way of illustrations specific embodiments in which a semiconductor device and a method of manufacturing a semiconductor device may be practiced. It is to be understood that other embodiments may be utilized, and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be between the electrically coupled elements, for example, elements that are controllable to temporarily provide a low-resistive connection in a first state and a high-resistive electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Ranges given for physical dimensions include the boundary values. For example, a range for a parameter y from a to b reads as a≤y≤b. A parameter y with a value of at least c reads as c≤y and a parameter y with a value of at most d reads as y d.

Main constituents of a layer or a structure from a chemical compound or alloy are such elements which atoms form the chemical compound or alloy. For example, nickel and silicon are the main constituents of a nickel silicide layer and copper and aluminum are the main constituents of a copper aluminum alloy.

Two adjoining doped regions of the same conductivity type and with different dopant concentrations form a unipolar junction, e.g., an n/n+ or p/p+ junction along a boundary surface between the two doped regions. At the unipolar junction a dopant concentration profile orthogonal to the unipolar junction may show a step or a turning point, at which the dopant concentration profile changes from being concave to convex, or vice versa.

According to an embodiment a semiconductor device may include a semiconductor body, a first portion, and a second portion. The first portion includes silicon and nitrogen and may be in direct contact with the semiconductor body. The second portion includes silicon and nitrogen and may be in direct contact with the first portion, wherein the first portion is between the semiconductor body and the second portion. An average silicon content in the first portion may be higher than in the second portion.

Both the first and the second portion may include silicon and nitrogen as the only main constituents. The first portion and/or the second portion may also include a significant portion of hydrogen that may form silicon-hydrogen bonds and nitrogen-hydrogen bonds. In addition, the first portion and/or the second portion may include impurities, for example, phosphorus, boron and/or carbon. The first portion and the second portion may form at least a portion of a passivation layer.

The first portion may be an electrically active semi-insulating layer with an electric resistivity in a range from $1 \times 10^7$ Ωcm (1E07 Ωcm) to $1 \times 10^{15}$ Ωcm (1E15 Ωcm). The first portion may show high electric blocking capability. The electric resistivity may be low enough to prevent the accumulation of electric charges, e.g., in a region of the semiconductor body close to the passivation layer.

The high silicon content may enable strong bonds between the first portion and a semiconductor body, e.g., a semiconductor body that is based on silicon, germanium or silicon carbide.

The second portion may be effective as firm and rugged protection layer. The second portion may protect the first portion and the semiconductor body in a humid environment, for example, against the incorporation of water. The second portion is rugged against electrochemical corrosion even in the presence of strong electrical fields.

Since the first portion and the second portion include the same constituents, adhesion between the second portion and the first portion may be better than, e.g., between a $Si_3N_4$ layer and DLC layer, or between a $Si_3N_4$ layer and a-SiC layer. The second portion may be formed immediately subsequent to the first portion and without interruption of a plasma applied during deposition, such that no intermediate layer, e.g., a native oxide layer or any kind of other interface, can form that could impair adhesion between the second portion and the first portion.

The passivation layer may be used as rugged electro active shielding of an edge termination structure, for mirror charge build-up and for contacting floating regions in the semiconductor body or other floating structures.

According to an embodiment, the semiconductor body may include a doped region of a semiconductor diode and/or of a transistor cell. For example, the doped region may form the anode or cathode region of a power semiconductor diode or the body region of a power transistor. By preventing charge accumulation, the first portion of the passivation layer may contribute to preserving the electrical blocking capability of power semiconductor devices.

According to an embodiment the semiconductor body may include an active region and an edge termination region between the active region and a side surface of the semiconductor body. The active region may include the doped region of a semiconductor diode or a transistor cell. A front side metallization may be in contact with the semiconductor body in the active region. The first portion may be in direct contact with the semiconductor body in the edge termination region. The first portion may show sufficient electrical blocking capability and sufficient high electric resistivity such that the first portion has no or only negligible impact on a standard operation mode of the semiconductor device. The first portion may show sufficient electric conductivity to avoid accumulation of charge carriers over a long time period, wherein the accumulated charge may contribute to a local increase of electric field strength at pn junctions in the edge termination region. A local bias of electric field strength may reduce the blocking capability of an edge termination structure formed in the edge termination region.

According to an embodiment the first portion may be in direct contact with a doped region of an edge termination structure formed in the edge termination region. The doped region of the edge termination structure may have the same conductivity type as the doped region in the active region. For example, the doped regions of the active region and the edge termination region may form pn junctions with a drift zone. The doped region in the active region may be an emitter region. In a blocking mode of the semiconductor device, the edge termination structure accommodates the electric field in a lateral direction, where the electric field strength may reach peak values close to locations, where pn junctions end at the front side. The first portion prevents an increase of the electric field strength that may be induced by electric charges accumulating in the passivation layer.

The edge termination region may include a junction termination extension (JTE) of the emitter region, wherein a doping concentration in the emitter region may be lower than in the doped region of the edge termination structure and wherein a vertical extension of the JTE may be smaller than a vertical extension of the emitter region.

The doped region in the edge termination region may include a zone of variable lateral doping (VLD), in which a dopant concentration gradually decreases with increasing distance to the active region. The edge termination structure may include one or more guard rings of the conductivity type of the emitter region, wherein the guard rings may extend from a first surface on a front side of the semiconductor body into the semiconductor body. Along a lateral direction, the guard rings may be spaced from each other by low-doped intermediate regions of the same conductivity type or by counterdoped intermediate regions.

In addition to VLD, JTE and/or guard rings, the edge termination structure may include a channel stopper of a conductivity type opposite to that of the emitter region. The channel stopper may extend along a side surface of the semiconductor body, wherein the side surface is tilted to the first surface.

According to an embodiment, at a top surface of the second portion a mean atomic ratio of silicon to nitrogen is at most 1.6. A refractive index at the top surface may be about 2.0. The atomic ratio of 1.6 corresponds to the atomic ratio in a "classical" silicon nitride typically formed by chemical vapor deposition (CVD). A silicon nitride layer with a mean atomic ratio of silicon to nitrogen of about 1.6 may be mechanically rugged and corrosion-resistant in the presence of strong electrical fields and may form an effective barrier against humidity.

According to an embodiment, the second portion may include at least 10 at % hydrogen. For example, the second portion may include at least 10 at % hydrogen and at most 14 at % hydrogen. A sufficiently high hydrogen content may tune the electrical characteristics of the second portion, e.g., the electrical resistivity and the blocking capability.

According to an embodiment, at a top surface of the second portion a ratio of an amount of silicon-hydrogen bonds Si—H to an amount of nitrogen-hydrogen N—H bonds is at most 1.6. The ratio of Si—H bonds to N—H bonds may be obtained from the infrared absorption bands of the bonds. A silicon nitride layer with a ratio of Si—H bonds to N—H bonds of about 1.6 may be mechanically rugged and corrosion-resistant in the presence of strong electrical fields and may form an effective barrier against humidity.

According to an embodiment the second portion may be insulating at the topmost surface, wherein the electrical resistivity at the top surface is greater than $1 \times 10^{12}$ Ωcm (1E12 Ωcm). The second portion may be more insulating than the first portion.

According to an embodiment a mean atomic ratio of silicon to nitrogen in the first portion at an interface between the semiconductor body and the first portion may be greater than 1.6, e.g., greater than 5 or greater than 6, wherein a refractive index may be about 2.2. For example, with Si:N>5, the first portion is "silicon-rich" and shows high blocking capability.

According to an embodiment, the first portion may include at least 10 at % hydrogen. For example, the first portion may include at least 10 at % hydrogen and at most 14 at % hydrogen. A sufficiently high hydrogen content may tune the electrical characteristics of the first portion, e.g., the electrical resistivity and the blocking capability.

According to an embodiment a mean ratio of the amount of Si—H bonds to the amount of N—H bonds in the first portion at an interface between the semiconductor body and the first portion may be greater than 1.6, e.g. greater than 5 or greater than 6. A refractive index may be about 2.2. With Si—H:N—H>5, the first portion is "silicon-rich" and shows high blocking capability. The electric resistivity of the "silicon-rich" first portion is high enough such that the first portion has no impact on the operation of the semiconductor device. The electric resistance of the "silicon-rich" first portion is sufficiently low to avoid a long-term charge accumulation that may degrade the blocking capability of the edge termination structure.

According to an embodiment the first portion may be semi-insulating at an interface between the semiconductor body and the first portion.

According to an embodiment the second portion may include a first subportion in contact with the first portion, wherein in the first subportion the silicon content steadily decreases with increasing distance to the first portion. The steadily decreasing silicon content facilitates an adjustment of the properties of the passivation layer in view of the electrical requirements, humidity resistance, and mechanical strength. The gradual transition from a "silicon-rich" silicon nitride layer to a "classical" silicon nitride layer avoids interfaces between layers of different composition and contributes to an improved mechanical stability of the passivation layer.

According to an embodiment the mean atomic ratio of silicon to nitrogen may decrease from at least 5, e.g., at least 6, to at most 1.8, e.g., at most 1.6 across a distance of at least 100 nm. According to another embodiment the ratio of Si—H bonds to N—H bonds may decrease from at least 5, e.g., at least 6, to at most 1.8, e.g., at most 1.6 across a distance of at least 100 nm.

According to another embodiment the second portion may include a second subportion along the top surface, wherein in the second subportion a silicon content is constant and does not depend from a distance to the first portion. With the thickness of the second portion the mechanical strength and humidity resistivity of the protection layer may be tuned without further impact on the electrical characteristics, which are mainly defined by the first portion and at most a part of the first subportion of the second portion.

According to an embodiment a thickness of the first portion may be in a range from 50 nm to 100 nm. For example, the thickness of the first portion corresponds to a minimum deposition time for establishing stable plasma parameters in a deposition chamber, wherein mass flow rates may be stabilized prior to plasma ignition.

According to an embodiment a thickness of the second portion may be at least 100 nm to achieve a sufficient smooth transition between "silicon-rich" silicon nitride and a "classical" silicon nitride.

According to an embodiment an index of refraction at a top surface of the second portion may be in a range from 1.9 to 2.1 at a wavelength of 673 nm.

According to another embodiment a method of manufacturing a semiconductor device may include providing a semiconductor substrate having a main surface. A first portion may be formed directly on the main surface. The first portion includes silicon and nitrogen. A second portion may be formed directly on the first portion. The second portion includes silicon and nitrogen. In the first portion, an average silicon content and/or an average content of Si—H bonds may be higher than in the second portion.

The second portion may be directly formed after the first portion, wherein the second portion may be formed without that the semiconductor body leaves a deposition apparatus, without that a plasma applied during deposition temporarily stops and without that any interface layer, e.g., a native oxide layer, is formed that may weak adhesion between the first portion and the second portion.

According to an embodiment forming the first and second portions may include a deposition process that uses a nitrogen containing precursor and a silicon containing precursor. During deposition of the first portion and/or during deposition of the second portion in a deposition chamber, a mass flow ratio between the silicon containing precursor and the nitrogen containing precursor into the deposition chamber may be gradually decreased.

The first portion may form an electrically active layer and the second portion may form a rugged protection layer. The electrically active layer and the protection layer of a passivation layer may be formed in an economic way by simply changing one or two flow rates during the deposition process. No interface layers such as native oxides form that may have adverse impact on device stability or that may deteriorate adhesion between the portions.

According to an embodiment the change of the flow rate ratio may include a decrease of the mass flow ratio between the silicon containing precursor and the nitrogen containing precursor by at most 100 sccm/s, wherein the electrical characteristics of the first portion and the second portion may be exactly tuned without negative impact on the stability of the passivation layer.

According to an embodiment, oxide may be removed from the main surface prior to forming the first portion. For example, the oxide may be removed using a reactive precursor, such as fluorine. After removal of the oxide the semiconductor substrate does not leave the deposition chamber until the first and the second portions of a passivation layer are formed. No critical interface layers that may deteriorate adhesion of the second portion on the first portion, for example, native oxide can form between the semiconductor substrate and the passivation layer such that the first portion can form strong bonds to the semiconductor substrate without interfaces along which a portion of the passivation layer may delaminate or may otherwise be weakened.

According to an embodiment the semiconductor substrate may include crystalline silicon. On crystalline silicon, a "silicon-rich" silicon nitride layer may form strong bonds that avoid delamination of the first portion from the semiconductor substrate.

Figure 1B:
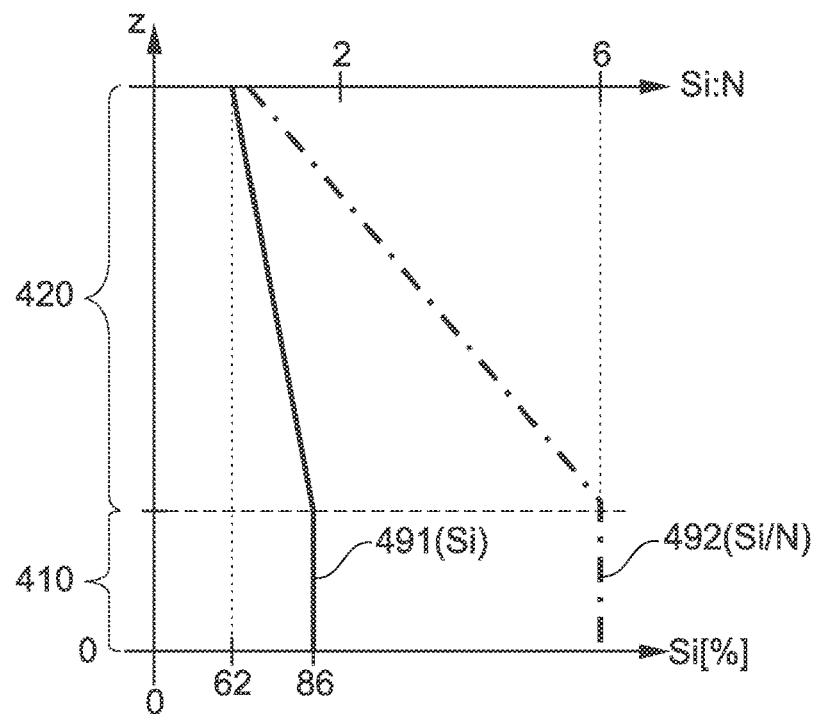
FIG. 1B is a schematic diagram illustrating the silicon content and the nitrogen content along line B-B' of FIG. 1A according to embodiments.

FIGS. 1A-1B refer to a semiconductor device 500 with a passivation layer 400 formed on a first surface 101 of a semiconductor body 100.

The semiconductor device 500 may be a power semiconductor device that may be used as a switch or rectifier in power electronics. For example, the semiconductor device 500 may be a semiconductor diode. According to an embodiment the semiconductor device 500 may include a plurality of substantially identical transistor cells TC electrically arranged in parallel. For example, the semiconductor device 500 may be a HEMT (high electron mobility transistor), an IGFET (insulated gate field effect transistor), for example, a MOSFET (metal oxide semiconductor FET) in the usual meaning including IGFETs with metals gates as well as IGFETs with polysilicon gates, a JFET (junction FET), an IGBT (insulated gate bipolar transistor, an MCD (MOS controlled diode), or a smart power semiconductor device that includes CMOS (complementary metal oxide semiconductor) circuits, such as a sensor circuit and/or control circuit in addition to a power semiconductor switch.

The semiconductor body 100 may be based on a semiconductor crystal with one or more main constituents. The main constituent(s) of the semiconductor crystal may be silicon (Si), germanium (Ge), silicon and germanium (Site), silicon and carbon (SiC), gallium and nitrogen (GaN), or gallium and arsenic (GaAs), by way of example. The semiconductor body 100 may include further materials, for example, unintentional impurities as a result of material and process imperfections and/or intentional additives, for example, dopant atoms and/or hydrogen atoms.

The first surface 101 defines a front side of the semiconductor device 500. Directions parallel to the first surface 101 are horizontal directions. A surface normal 104 to the first surface 101 defines a vertical direction.

The passivation layer 400 includes a first portion 410 in direct contact with the first surface 101 and a second portion 420 formed on the first portion 410, wherein the first portion 410 separates the second portion 420 from the semiconductor body 100. The first portion 410 and the second portion 420 may include silicon and nitrogen as only main constituents or may include a significant portion of hydrogen, e.g., at least 10 at % hydrogen.

The first portion 410 and the second portion 420 differ as regards the ratio between silicon and nitrogen and/or may differ as regards a ratio of Si—H bonds to N—H bonds. For example, the silicon-to-nitride atomic ratio Si:N may be constant in the first portion 410 and may decrease, for example, steadily decrease with increasing distance z to the first surface 101 in the second portion 420. According to another embodiment, Si:N may decrease in the first portion 410 at a lower rate than in the second portion 420.

According to another example, the Si—H:N—H ratio may be constant in the first portion 410 and may decrease, for example, steadily decrease with increasing distance z to the first surface 101 in the second portion 420. According to another embodiment, the Si—H:N—H ratio may decrease in the first portion 410 at a lower rate than in the second portion 420.

A vertical extension d1 of the first portion 410 may be in a range from 50 nm to 100 nm, by way of example. A vertical extension d2 of the second portion 420 may be in a range from 100 nm to several μm, for example 800 nm.

FIG. 1B shows the vertical gradient 491 of the silicon content and the vertical gradient 492 of the silicon-to-nitrogen atomic ratio Si:N along line B-B' in FIG. 1A. In the first portion 410 both the silicon content and the silicon to nitrogen ratio may be constant. For example, in the first portion 410 the atomic ratio Si:N may be about 6. The silicon content in the first portion 410 may be about 85%. In the second portion 420 the atomic ratio Si:N may decrease in a range from 6 to 1.6 across at least 100 nm thickness.

At a top surface 429 of the second portion 420 the atomic ratio Si:N may be at most 1.8, e.g., at most 1.6 and the refractive index may be in a range from 1.98 to 2.02 at a wavelength of 673 nm. In a horizontal cross-sectional plane of the first portion 410 the refractive index may be at least 2.15, for example, about 2.2 at a wavelength of 673 nm.

At least the first portion 410 may include a substantial amount of hydrogen, for example, at least 10 at % hydrogen and at most 14 at % hydrogen, wherein the vertical gradient 491 may indicate the amount of Si—H bonds and the vertical gradient 492 the Si—H:N—H ration along line B-B' in FIG. 1A. In the first portion 410 both the amount of Si—H bonds and the SiH:N—H ratio may be constant. For example, in the first portion 410 the Si—H:N—H ratio may be about 6. In the second portion 420 the ratio Si—H:N—H may decrease from about 6 to about 1.6 across at least 100 nm thickness. At the top surface 429 of the second portion 420 the Si—H:N—H ratio may be at most 1.8, e.g., at most 1.6.

The "silicon-rich" first portion 410 forms an electrically active, semi-insulating layer with high voltage blocking capability. The electric resistivity of the first portion 410 is high enough such that it does not adversely affect the operation of the semiconductor device 500. A leakage current through the first portion 410 may be negligible. The electric resistivity of the first portion 410 may be low enough such that during the lifetime of the semiconductor device 500 charge accumulation in the first portion 410 is negligible.

At least a top section of the second portion 420 may form a protection layer with high humidity impermeability, high mechanical stability, and high ruggedness, wherein the protection layer is corrosion-resistant and does not deteriorate when exposed to strong electric fields. The electrical and mechanical properties of the passivation layer 400 may be tuned in a simple way by varying the thickness of the first portion 410 and the length of the transition from "silicon-rich" to an atomic ratio Si:N of about 1.6.

Figure 2A:
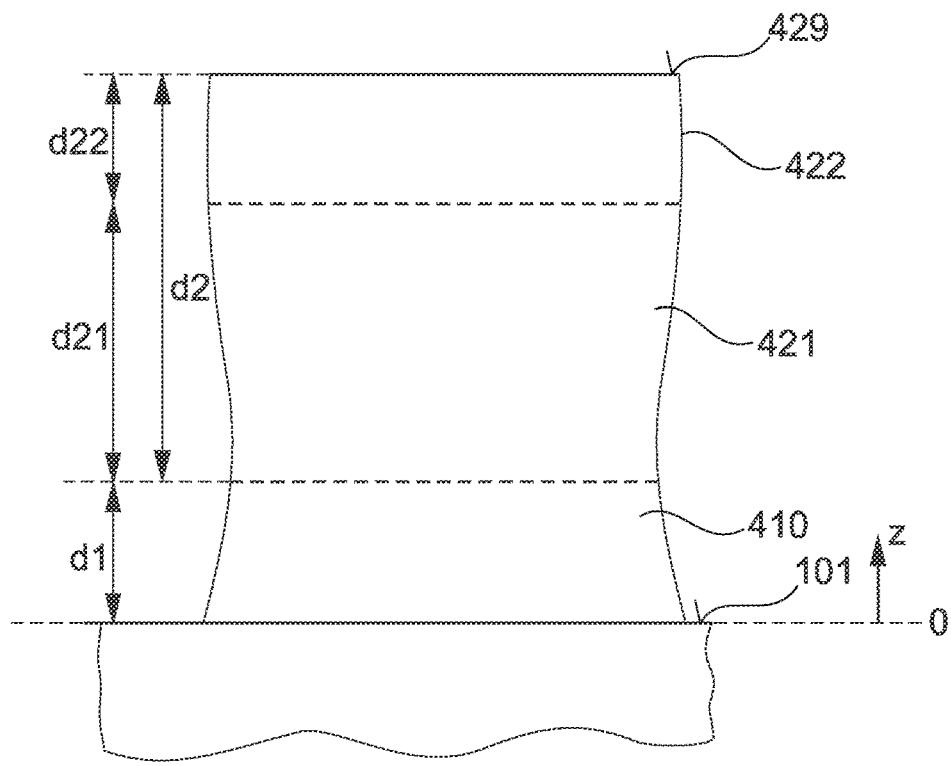
FIG. 2A is a schematic vertical cross-sectional view of a portion of a semiconductor device with a second portion including sub-sections according to another embodiment.
Figure 2B:
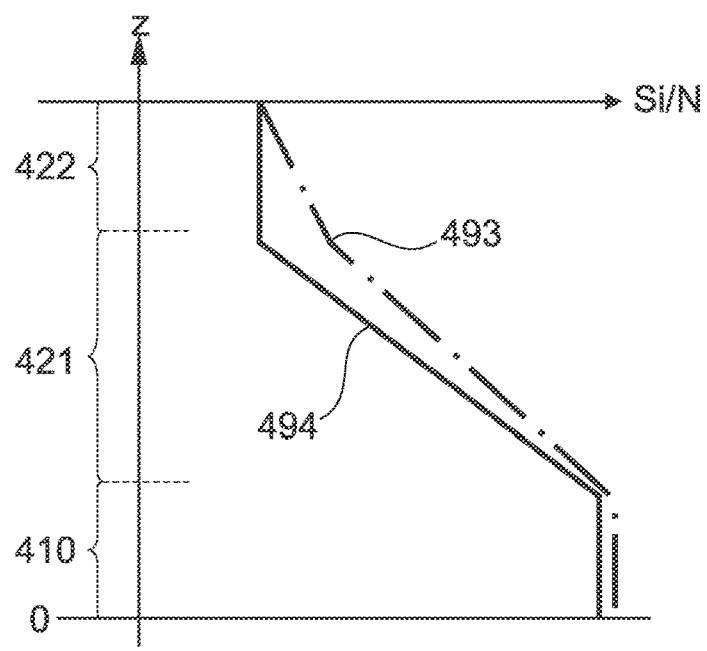
FIG. 2B is a schematic diagram illustrating the silicon content and the nitrogen content along line B-B' of FIG. 2A according to embodiments.

In FIGS. 2A-2B the second portion 420 of the passivation layer 400 includes a first subportion 421 in contact with the first portion 410 and a second subportion 422 in contact with the first subportion 421, wherein the first subportion 421 separates the second subportion 422 from the first portion 410. In the first subportion 421 the silicon content may steadily decrease with increasing distance z to the first surface 101. In the second subportion 422 the atomic ratio Si:N may be constant with increasing distance z to the first surface 101 as indicated with line 494 in FIG. 2B or the atomic ratio Si:N may decrease at a lower rate as in the first subportion 421 as indicated with line 493 in FIG. 2B.

According to an embodiment the sum of the vertical extension d1 of the first portion 410 and the vertical extension d21 of the first subportion 421 may be in the range of 50 nm to 100 nm and the vertical extension d22 of the second subportion 422 may be in a range from 500 nm to 1 µm. The first portion 410 and the first subportion 421 of the second portion 420 may determine the number and/or density of interface states and the second subportion 422 may define the mechanical strength and the barrier properties of the passivation layer 400.

Figure 3:
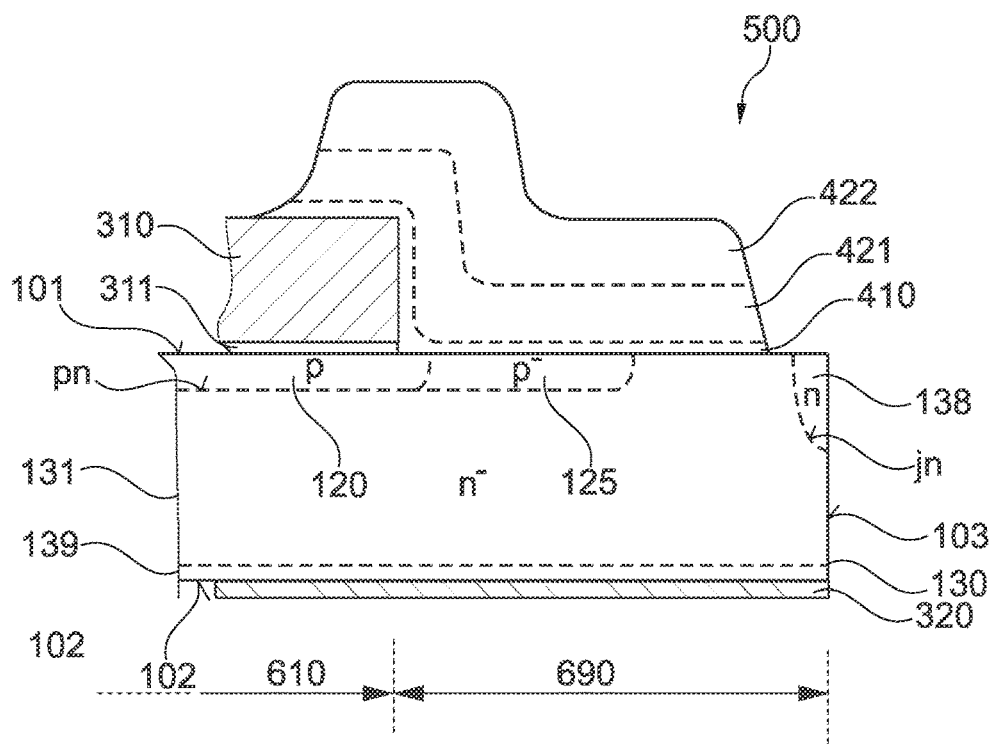
FIG. 3 is a schematic vertical cross-sectional view of a portion of a semiconductor device including a junction termination extension according to a further embodiment.

FIG. 3 shows an example of a semiconductor device 500 with a semiconductor body 100 and a passivation layer 400. The semiconductor device 500 may be an MOSFET, an IGBT or a semiconductor diode. For example, the semiconductor device 500 may be a vertical power semiconductor device with a load current flow between a first load electrode, which may include a front side metallization 310, at a front side of the semiconductor body 100 and a second load electrode 320 at a backside of the semiconductor body 100. A thickness of the semiconductor body 100 between a first surface 101 at the front side and a second surface 102 at the backside may be in the range of several hundred nm to several hundred µm.

The semiconductor body 100 may be a single-crystal that contains silicon (Si) or Germanium (Ge) as a main constituent, e.g., single-crystalline silicon (Si), single crystalline germanium-silicon (Site), single-crystalline silicon carbide (SiC), or single-crystalline silicon (Si).

The semiconductor body 100 may include a doped region 120 formed in an active region 610 between the first surface 101 and a drain/drift structure 130. The drain/drift structure 130 may include at least a lightly doped drift zone 131 and a heavily doped contact portion 139 between the drift zone 131 and the second surface 102. The drift zone 131 accommodates the blocking voltage in a blocking mode of the semiconductor device 500.

The heavily doped contact portion 139 may form an ohmic contact with the second load electrode 320. In case the semiconductor device 500 is an MOSFET or a semiconductor diode, the contact portion 139 may form a unipolar junction with the drift zone 131. In case the semiconductor device 500 is or contains a reverse blocking IGBT, the contact portion 139 has the opposite conductivity type of the drift zone 131. In case the semiconductor device 500 is a reverse conducting IGBT, the contact portion 139 may include zones of both conductivity types extending between the drift zone 131 and the second surface 102. The contact portion 139 may directly adjoin the drift zone 131 or an additional layer of the conductivity type of the drift zone 131 but with a higher dopant concentration may be formed between the drift zone 131 and the contact portion 139.

The doped region 120 in the active region 610 may form an emitter region and may include the anode region or cathode region of a power semiconductor diode or the body regions of transistor cells, wherein the transistor cells may be electrically connected in parallel.

An edge termination region 690 may surround the central active region 610 and may separate the central active region 610 from a side surface 103 of the semiconductor body 100, wherein the side surface 103 connects the first surface 101 and the second surface 102.

The edge termination region 690 may include an edge termination structure. In the blocking state of the semiconductor device 500 the edge termination structure accommodates a lateral electric field caused by the blocking voltage between the emitter region 120 and the drift/drain structure 130.

In the illustrated embodiment the edge termination structure includes a junction termination extension 125. The junction termination extension 125 may be in direct contact with the emitter region 120. The junction termination extension 125 may be in contact with the first surface 101 or may be spaced from the first surface 101. A mean dopant concentration in the junction termination extension 125 may be lower than in the emitter region 120. A vertical extension of the junction termination extension 125 may be equal to or smaller than a vertical extension of the doped region 120 in the active region 610.

The edge termination structure may further include a channel stopping region 138 formed along an edge between the first surface 101 and the side surface 103. The channel stopper region 138 is more heavily doped than the drift zone 131 and may form a unipolar junction with the drift zone 131.

A passivation layer 400 as described with reference to any of the preceding figures is in direct contact with the semiconductor body 100 in the edge termination region 690. The passivation layer 400 may extend across a sidewall of the front side metallization 316. A portion of the passivation layer 400 may be formed on a part of the front side metallization 310.

The electric resistivity of the passivation layer 400 is high enough such that no or only a negligible leakage current flows across the passivation layer 400. The first portion 410 of the passivation layer 400 may drain off electric charges, which may migrate into the passivation layer 400 during the lifetime of the semiconductor device 500 and which may influence the breakdown and avalanche characteristics of the edge termination structure.

Figure 4:
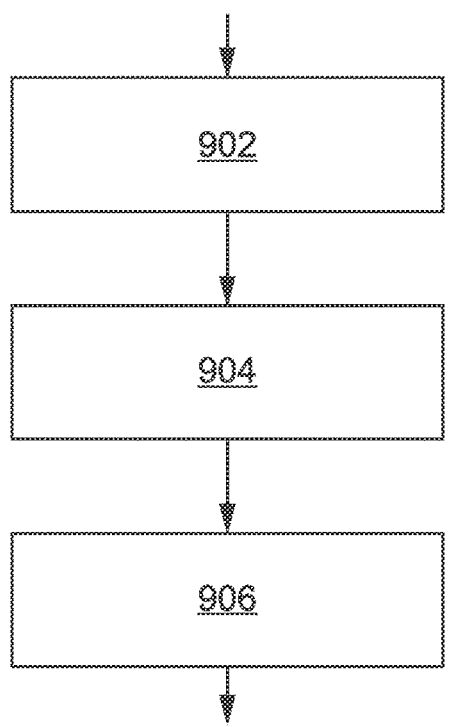
FIG. 4 is a simplified flowchart schematically illustrating a method of manufacturing a semiconductor device according to a further embodiment.

FIG. 4 refers to a method of manufacturing a semiconductor device. A semiconductor substrate with a main surface is provided (902). A first portion is formed directly on the main surface, wherein the first portion includes silicon and nitrogen (904). A second portion is formed directly on the first portion, wherein the second portion includes silicon and nitrogen and wherein in the first portion an average silicon content is higher than in the second portion (906).

Figure 5A:
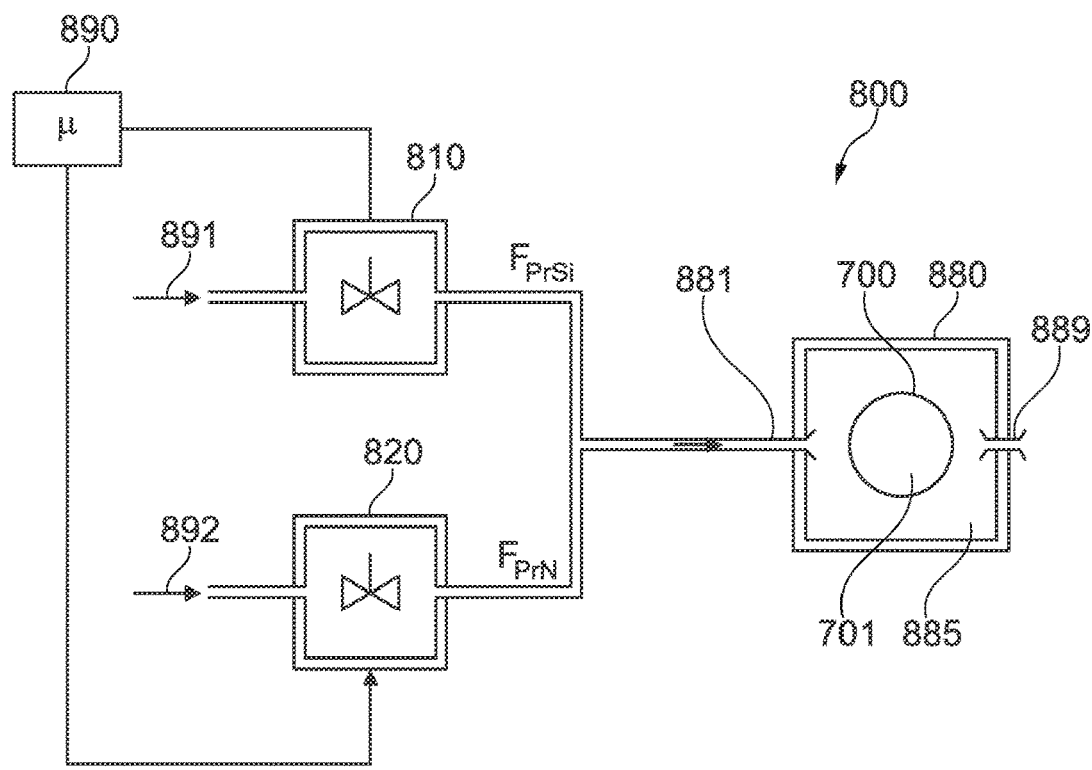
FIG. 5A is a schematic block diagram of a deposition apparatus for a method of manufacturing a semiconductor device according to a further embodiment.

FIG. 5A schematically shows a deposition apparatus 800. The deposition apparatus 800 may be, for example a CVD (chemical vapor deposition) apparatus, for example an APCVD (atmospheric pressure CVD), an LPCVD (low pressure CVD) or a PECVD (plasma enhanced CVD) apparatus, or an apparatus for PVD (physical vapor deposition).

A semiconductor substrate 700 can be placed in a deposition chamber 885 of a reactor 880. The reactor 880 may include electrodes for generating a plasma. A first MFC (mass flow controller) 810 controls a gas flow $F_{PrSi}$ of a silicon containing precursor 891 and a second MFC 820 controls a gas flow $F_{PrN}$ of a nitrogen containing precursor through a main inlet 881 into the deposition chamber 885. The first and second MFCs 810, 820 may control a rate of flow of a gaseous compound or gaseous mixture that passes the MFC according to a selected set point. For example, the MFC may include a mass flow sensor, a control valve and an internal control unit that may compare a value of the gas flow obtained from the mass flow sensor to adjust the control valve in an appropriate way to achieve a flow rate according to the selected set point.

Figure 5B:
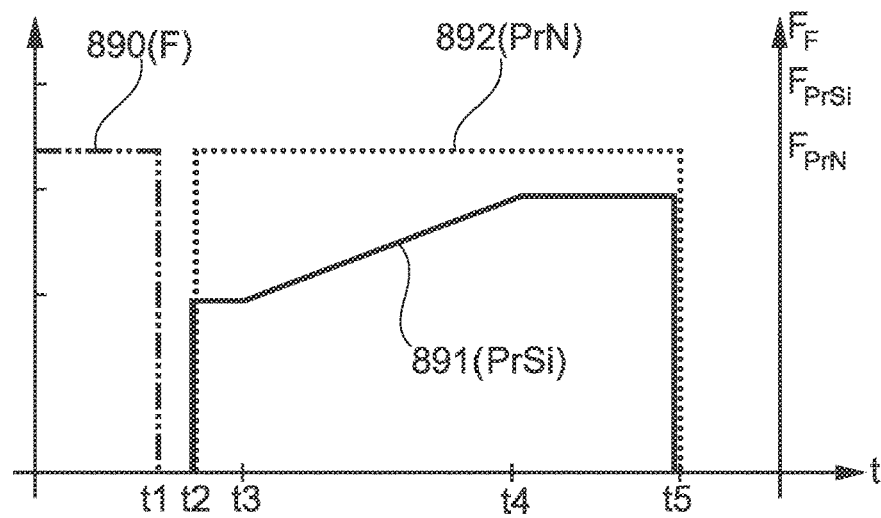
FIG. 5B is a schematic time chart for illustrating a process performable with the deposition apparatus of FIG. 5A.

A processor unit 890 may be data-linked with the first MFC 810 and the second MFC 820. The processor unit 890 may control the deposition apparatus 800 to form a passivation layer 400 with a first portion 410 and a second portion 420 as described with reference to FIGS. 1A to 3. The processor unit 890 may be an integrated part of the deposition apparatus 800 or may include a stored-program control assigned to and data-linked with the deposition apparatus 800. The processor unit 890 may be a computer, a server or a part of a network of servers and computers executing a software code. The processor unit 890 may execute a method of controlling the first and second MFCs 810, 820 in a way as described with reference to FIG. 5B.

A semiconductor substrate 700 may be placed in the deposition chamber 885 of the reactor 880. Between t=0 and t=1 an etchant may be introduced into the deposition chamber 885, wherein the etchant is adapted to remove a native oxide from a main surface 701 at the front side of the semiconductor substrate 700. For example, the etchant may include fluorine radicals. For t1<t<t2 an inert gas, for example, a noble gas may purge the deposition chamber 885 and may remove the fluorine radicals.

For t2<t<t3 a silicon containing precursor 891 and a nitrogen containing precursor 892 may be introduced into the deposition chamber 885 at a constant ratio. The silicon containing precursor may include, for example, a silane, for example, silane $SiH_4$, TCS (trichlorosilane $HSiCl_3$) or tetrachlorosilane $HSiCl_4$. The nitrogen containing precursor may include, for example, ammonium ($NH_4$) and/or nitrogen gas ($N_2$).

The ratio of the silicon containing precursor to the nitrogen containing precursor may be greater than 3, for example greater than 3.5. According to an embodiment the flowrate ratio may be between 4.9 and 5.1. The temperature in the deposition chamber may be set to about 400° C., by way of example. The reactor 880 may activate a high-frequency plasma, wherein energetic electrons in the plasma may ionize or dissociate at least one of the silicon containing precursor and the nitrogen containing precursor to generate more chemically reactive radicals. A "silicon-rich" silicon nitride layer deposited at high deposition power, e.g., about 2.6 W/cm² may show high voltage blocking capability.

For t3<t<t4 the flowrate ratio of the silicon containing precursor to the nitrogen containing precursor may steadily decrease. Since the total gas flow changes only to a comparatively low degree, the plasma may be continuously applied from at least t3 to t5 or from t2 to t5 without change or without significant change. With continuously applied plasma, the process can be highly stable.

In the illustrated example, only the mass flow of the silicon containing precursor is reduced. According to other embodiments, the gas flow of the nitrogen containing precursor may be increased or both the mass flow of the nitrogen containing precursor may be increased and the mass flow of the silicon containing precursor may be decreased. The period between t3 and t4 may last for at least 2 seconds and for at most 10 seconds. The flowrate change of the silicon containing precursor may be at most 100 sccm/s.

According to an embodiment, the silicon containing precursor is silane $SiH_4$ and the nitrogen containing precursor is $NH_3$. The $NH_3$ flowrate may be 100 sccm and the flowrate of silane may be reduced from 500 sccm to 300 sccm. Gaseous nitrogen $N_2$ may be supplied at a flowrate of 4000 sccm. The pressure in the deposition chamber 885 may be between 1 Torr and 10 Torr and the temperature in the deposition chamber 885 may be between 350° C. and 500° C.

For t4<t<t5 the flow rate ratio between the silicon containing precursor and the nitrogen containing precursor may be held constant. The period between t4 and t5 may last for at least 2 s and at most 60 s and may result in a deposited layer with a thickness of about 800 nm.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor body comprising an active region and an edge termination region between the active region and a side surface of the semiconductor body;
   a first portion comprising silicon and nitrogen;
   a second portion comprising silicon and nitrogen, the second portion being in direct contact with the first portion; and
   a front side metallization in contact with the semiconductor body in the active region,
   wherein the first portion separates the second portion from the semiconductor body,
   wherein an average silicon content in the first portion is higher than in the second portion,
   wherein the front side metallization is interposed between the first portion and the semiconductor body in the active region but not in the edge termination region.

2. The semiconductor device of claim 1, further comprising an oxide layer interposed between the first portion and the semiconductor body.

3. The semiconductor device of claim 1, wherein the semiconductor body comprises a doped region of a semiconductor diode and/or of a transistor cell.

4. The semiconductor device of claim 1, wherein the first portion is in direct contact with a doped region of an edge termination structure formed in the edge termination region.

5. The semiconductor device of claim 1, wherein at a top surface of the second portion, a mean atomic ratio of silicon to nitrogen is at most 1.6.

6. The semiconductor device of claim 1, wherein the second portion comprises at least 10 at % hydrogen.

7. The semiconductor device of claim 1, wherein at a top surface of the second portion, a ratio of silicon-hydrogen bonds to nitrogen-hydrogen bonds is at most 1.6.

8. The semiconductor device of claim 1, wherein a top surface of the second portion is insulating.

9. The semiconductor device of claim 1, wherein at an interface between the semiconductor body and the first portion, a mean atomic ratio of silicon to nitrogen in the first portion is greater than 5.

10. The semiconductor device of claim 1, wherein the first portion comprises at least 10 at % hydrogen.

11. The semiconductor device of claim 1, wherein at an interface between the semiconductor body and the first portion, a ratio of silicon-hydrogen bonds to nitrogen-hydrogen bonds is greater than 5.

12. The semiconductor device of claim 1, wherein at an interface between the semiconductor body and the first portion, the first portion is semi-insulating.

13. The semiconductor device of claim 1, wherein the second portion comprises a first subportion in contact with the first portion, and wherein in the first subportion a silicon content steadily decreases with increasing distance to the first portion.

14. The semiconductor device of claim 13, wherein the silicon content in the first subportion decreases with increasing distance to the first portion from at least 5 to at most 1.8 by at least 100 nm.

15. The semiconductor device of claim 1, wherein the second portion comprises a second subportion along a top surface of the second portion, and wherein in the second subportion a silicon content is constant.

16. The semiconductor device of claim 1, wherein a thickness of the first portion is in a range from 50 nm to 100 nm.

17. The semiconductor device of claim 1, wherein a thickness of the second portion is at least 100 nm.

18. The semiconductor device of claim 1, wherein an index of refraction at a top surface of the second portion is in a range from 1.9 to 2.1 at a wavelength of 673 nm.

19. A semiconductor device, comprising:
a semiconductor body comprising an active region and an edge termination region between the active region and a side surface of the semiconductor body;
a first portion comprising silicon and nitrogen;
a second portion comprising silicon and nitrogen, the second portion being in direct contact with the first portion; and
a front side metallization in contact with the semiconductor body in the active region,
wherein the first portion separates the second portion from the semiconductor body,
wherein an average silicon content in the first portion is higher than in the second portion,
wherein the first portion and the second portion are both present in the edge termination region, and neither the first portion nor the second portion is present in the active region.

20. The semiconductor device of claim 19, further comprising an oxide layer interposed between the first portion and the semiconductor body.

* * * * *